United States Patent [19]

Kendall et al.

[11] 4,017,885

[45] Apr. 12, 1977

[54] LARGE VALUE CAPACITOR

[75] Inventors: Don L. Kendall; Walter T. Matzen, both of Richardson, Tex.

[73] Assignee: Texas Instruments Incorporated, Dallas, Tex.

[22] Filed: Dec. 13, 1974

[21] Appl. No.: 532,334

Related U.S. Application Data

[63] Continuation-in-part of Ser. No. 409,509, Oct. 25, 1973, Pat. No. 3,962,713, which is a continuation of Ser. No. 259,332, June 2, 1972, abandoned.

[52] U.S. Cl. .................................. 357/51; 156/648; 148/175; 357/14; 357/15; 357/23; 357/55; 357/60

[51] Int. Cl.² ................... H01L 27/04; H01L 29/04; H01L 29/92

[58] Field of Search .................. 357/14, 23, 51, 55, 357/60, 15; 317/249 R, 261

[56] References Cited

UNITED STATES PATENTS

| 2,841,508 | 7/1958 | Roup et al. | 357/14 |
|---|---|---|---|
| 3,460,050 | 8/1969 | Hellstrom | 357/14 |
| 3,579,057 | 5/1971 | Stoller | 357/60 |
| 3,586,925 | 6/1971 | Collard | 357/14 |
| 3,639,814 | 2/1972 | Engbert | 357/14 |
| 3,745,508 | 7/1973 | Bruder et al. | 317/249 R |

Primary Examiner—William D. Larkins
Attorney, Agent, or Firm—Harold Levine; James T. Comfort; Gary C. Honeycutt

[57] ABSTRACT

Disclosed is a semiconductor capacitor which utilizes the volume of the semiconductor substrate in which it is formed to create increased surface area and thereby to provide increased capacitance. The surface area is increased by forming selectively spaced grooves in the surface of the semiconductor substrate by orientation dependent etches and utilizing the sidewalls of the grooves as surface. Groove depth is limited to a predetermined value by etching time, geometrical constraints, or by etch stops. This provides for precise control of capacitance values on a batch or commercial basis. Increases up to at least 100-fold in capacitance as compared to a flat capacitor structure as possible. A thin layer of dielectric is formed over the increased surface area, and thereafter a conducting layer is formed over the dielectric layer to provide a dielectric capacitor. An active junction P-N capacitor may also be formed.

7 Claims, 20 Drawing Figures

LARGE VALUE CAPACITOR

This application is a continuation-in-part of Serial No. 409,509, filed Oct. 25, 1973, now U.S. Pat. No. 3,962,713, which is a continuation of Ser. No. 259,332, filed June 2, 1972 now abandoned.

This invention relates to capacitors and methods of forming capacitors in general, and more specifically to the utilization of an orientation dependent etch or other controllable etching process to provide a large surface area for the capacitor to allow a large capacitance per unit volume in such devices, as well as accurate control of capacitance values on a batch or commercial scale.

As integrated circuits come of age, the demand to integrate complex functions increases. Many complex circuits require utilization of capacitance, and a large capacitance requirement has often been a limiting factor in determination of the feasibility of integrating. A capacitor has traditionally required a large area to provide a practical amount of capacitance, and, as integrated circuits become advantageous due to their diminuitive size, the large area required for the capacitor may offset the advantages of integrating.

Besides integrated circuits, discrete capacitors providing a maximum capacitance per device volume, are becoming increasingly important, as in such applications as space systems and missile guidance systems. In some applications, utilization of a dielectric having the highest relative dielectric constant $\epsilon$ may not be sufficient to provide the required capacitance per unit area, and yet maintain the quality of the capacitor. That is, a dielectric having a sufficient $\epsilon$ may have too high a loss tangent, an excessively low breakdown voltage, and improper temperature sensitivity and temperature range. For example, a silicon dioxide on silicon substrate capacitor exhibits superior lost tangent characteristics, and temperature sensitivity, and temperature range. However, such a capacitor exhibits a relatively low $\epsilon$ (approximately 3.8), and accordingly, use of such a device has been traditionally restricted.

The prior art has recognized the fact that the capacitance of a capacitor can be increased by increasing the surface area of one or both of the capacitor surfaces as demonstrated in the patent to Alwitt et al., U.S. Pat. No. 3,697,822, and much other prior art. While prior art capacitors have obtained increased capacitance values in this manner, there has been a lack of control over capacitance values in the prior art. The prior art capacitors of the above described type have also been limited to about a 20-fold increase over the flat surface capacitors and it has also been difficult to apply leads to such capacitors because the holes formed in the surface are too small for leads to be placed thereon.

Accordingly, it is an object of the present invention to produce a method for providing a larger effective surface area in thin film capacitors by increasing the capacitance per utilized slice area. It is another object of the invention to provide a method for producing capacitors having a high capacitance per utilized slice area in integrated circuits. It is still a further object of the present invention to provide a capacitor having a large surface area to allow large capacitances. It is still a further object of the present invention to produce an integrated circuit having a large value capacitor provided therein. It is another object of the present invention to provide a silicon-dielectric capacitor and a silicon P-N junction capacitor having a high value of capacitance. It is yet another object of the present invention to provide a method for producing a silicon-dielectric capacitor utilizing orientation dependent etch. It is yet another object of the present invention to provide a method for producing a high value capacitor utilizing selective plasma and ion etching. It is yet a further object of this invention to provide a method of forming semiconductor capacitors utilizing a controllable etching method to provide capacitors of desired value within a very small tolerance on a batch or commercial scale. It is a still further object of this invention to provide semiconductor capacitors of predetermined capacitance value by a controlled etch method to provide accurate control of surface area of the etched surface.

Briefly, and in accordance with the present invention, a plurality of selectively spaced grooves are formed in the upper surface of a semiconductor substrate using an orientation dependent etch, an ion etchant, or other controllable etching method. By choosing a substrate material having a surface lying substantially in the {110} crystallographic plane, using a suitable orientation dependent etch, the sidewalls of the grooves lie substantially perpendicular to the surface in the {111} plane. By utilizing the sidewalls of the grooves as surface area, a high value capacitor is produced when subsequent layers of dielectric and metal overlying the surface are added having up to at least a 100-fold increase in capacitance as compared with like flat surface capacitors. Also, an active P-N junction capacitor is formed after forming the grooves by providing a continuous P-N junction in the surface of the substrate. The method and the devices produced thereby utilize a significant volume of the substrate to maximize the capacitance per area possible, instead of merely utilizing the traditional planar surface area. Also, due to the high degree of control over the etching process, the capacitance values can be controlled to within about $\pm 2\%$ with high yield.

The novel features believed to be characteristic of this invention are set forth in the appended claims. The invention itself, however, as well as other objects and advantages thereof, may be best understood by reference to the following detailed description when read in conjunction with the accompanying drawings, wherein:

DETAILED DESCRIPTION OF THE INVENTION

For purposes of illustrational simplicity and clarity, the figures contained herein are not geometrically proportioned. The dimensions given in the following detailed description of each figure are to be construed as exemplary dimensions and are not to be considered in disagreement with the drawings. Furthermore, as a plurality of embodiments have been illustrated, those embodiments having common elements with other embodiments have the same part number for clarity and simplification of description.

Figure 1A:
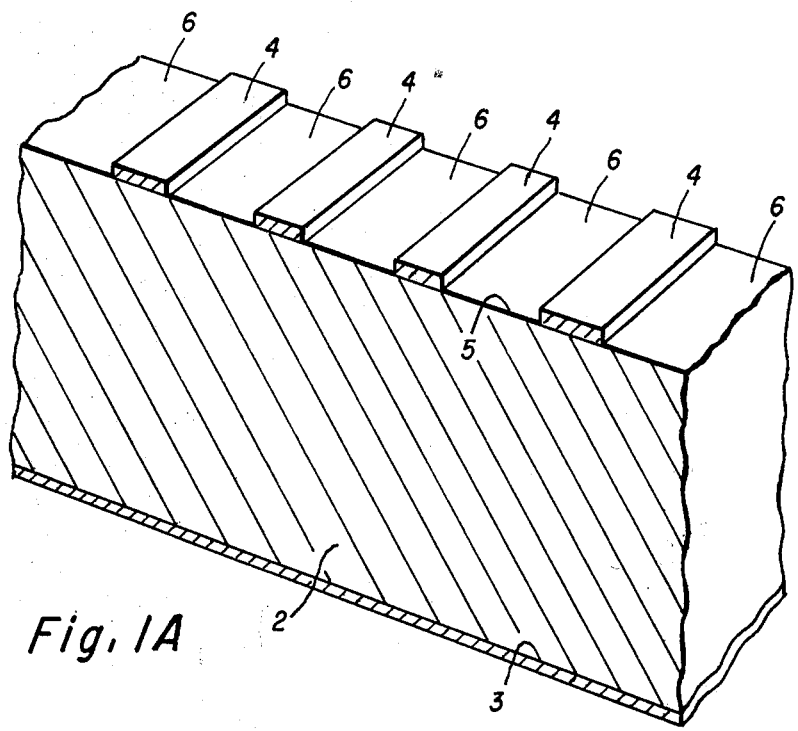
FIG. 1A depicts a portion of a semiconductor substrate having thereon a masking layer with a desired mask pattern etched therein.

Referring now to the drawings, FIG. 1A illustrates a segment of a slice of semiconductor material 2 typically utilized in the invention. In this embodiment the slice 2 is heavily doped monocrystalline silicon having at most a 0.02 ohm-centimeter resistivity, and may be, for example, a P-type silicon doped with boron, gallium or other Group III elements. A doping concentration of at least $5 \times 10^{18}$ atoms/cc provides such a resistivity. Slice 2 has a crystal orientation of {110} as denoted by conventional Miller indices with respect to surfaces 3 and 5. It is emphasized that a {110} crystal orientation substrate 2 is not crucial for the invention, but it utilized here because it allows an advantageous groove structure as will hereafter be explained in detail. However, other crystal orientations such as {111} and {100} may also be utilized without departing from the spirit of the invention.

Formation of {110} monocrystalline silicon material is well-known in the art and may be grown in ingots and sliced thereafter such that the resulting surface is substantially coplanar with the {110} crystallographic plane. Accordingly, upper surface 5 and lower surface 3 of the slice 2 lie in the {110} plane. However, the slice may be cut such that the surfaces lie at an angle of several degrees from the {110} plane. In such cases the walls of the grooves are still essentially perpendicular to the {110} plane, only lying at an angle with the surface 5. After removal from the ingot, the surfaces 3 and 5 are finished by conventional lapping, grinding or chemical polishing techniques. Substrate 2 is of any suitable length and width, but typically has a thickness of 25 milli-inches (mils).

Coating the substrate 2 is an etch resistant layer 4 of silicon nitride, which is deposited by any of the several well-known techniques in the art. A typical thickness of nitride is 2,000 angstroms (A). Other well-known materials, such as silicon dioxide and gold, are suitable etch resistant layers.

Conventional photolithograhic etch procedures provide a desired mask pattern selectively positioned in the nitride layer overlying upper surface 5. Utilizing principles of mask alignment which are well-known in the art of orientation dependent etch (ODE), apertures 6 in FIG. 1A are defined in the masked pattern to lie substantially parallel, to an accuracy of ± 0.1° in order to get a one hundred-fold area gain, to the line defined by the intersection of the {111} plane with the substantially {110} surface. It is to be understood that hereafter a {110} surface is denoted as a surface substantially lying in the {110} plane, but may lie at as much as an angle as 20° to the {110} plane. Forming slices at this angle may considerably simplify subsequent processing steps. As is well-known, a {110} crystallographic oriented silicon body has two sets of {111} planes, which are perpendicular to the {110} surface. One of the sets of {111} planes intersects the other {111} plane on the {110} surface at angles of 70.53° and 109.47°.

After having etched the desired masking pattern in the nitride layer 4, the substrate 2 is then etched with ODE. That is, in FIG. 1B the moats formed thereby take the form of grooves 8 within the substrate 2, which are bounded by sidewalls 9 lying in the {111} planes, which accordingly are perpendicular to the {110} surfaces 3 and 5. The etchant utilized exhibits a slower etch rate in the {111} plane than it exhibits in the {110} or other planes. Various etching solutions exhibit this property as is disclosed in *J. Electrochemical Society*, Vol. 114, 1967, page 965. For a more detailed explanation of the phenomena of orientation dependent etching {110} material along the {111} planes, reference is made to copending patent application assigned to the assignee of this application, IMPROVEMENT IN METHODS FOR FORMING CIRCUIT COMPONENTS WITHIN A SUBSTRATE AND SEMICONDUCTOR SUBSTRATE, Ser. No. 788,177, filed Dec. 31, 1968 now abandoned.

A 50% potassium hydroxide/water mixture is utilized for the orientation dependent etch. At 85°, the etch rate in the {110} direction in grooves of 0.1 mils width along the {111} plane is approximately 0.060 mils per minute. Accordingly, a slice 20 mils thick is completely etched in the {110} direction in approximately 330 minutes. Miller indices convention dictates that direction is defined as perpendicular to the plane, so a {110} direction lies in the {111} sidewall plane. As noted earlier, the grooves produced thereby are bounded by {111} sidewalls 9 substantially perpendicular to the {110} surface.

Figure 1B:
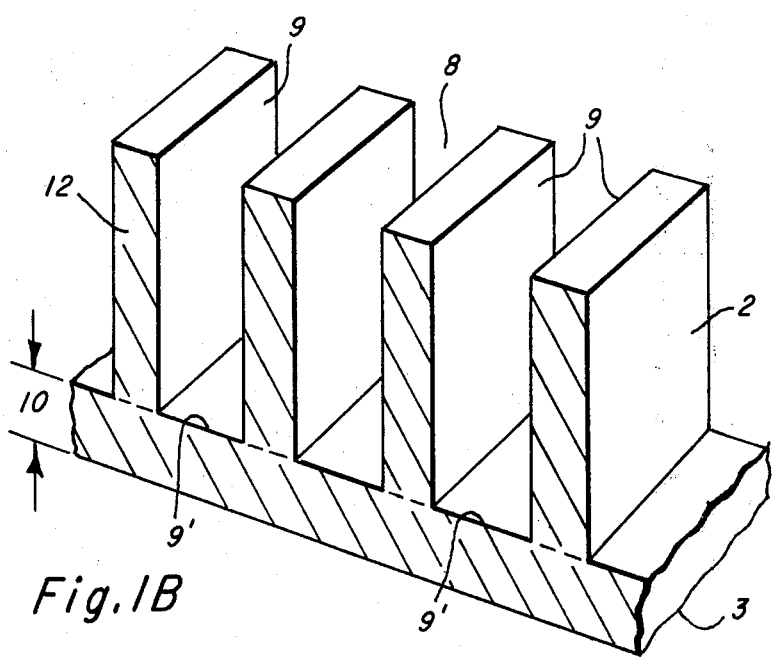
FIG. 1B depicts the semiconductor substrate of FIG. 1A having orientation dependent etched grooves therein.

After etching the substrate for approximately 330 minutes, grooves 8 are produced in FIG. 1B, which are approximately 20 mils deep. In this embodiment the preferential etch is discontinued before a 25 mil groove is produced. The remaining 5 mils of substrate, which is denoted by numeral 10, provides, for example, suitable mechanical strength for the slice. After removing the nitride layer 4, by conventional etching techniques, the basic structure depicted in FIG. 1B is produced, which is characterized as a body of silicon material having therein upper and lower surfaces 3 and 5 lying in the {110} plane. A preselected pattern of orientation dependent etched grooves 8 are bounded by sidewalls 9 which lie substantially perpendicular to the {110} plane.

Figure 3:
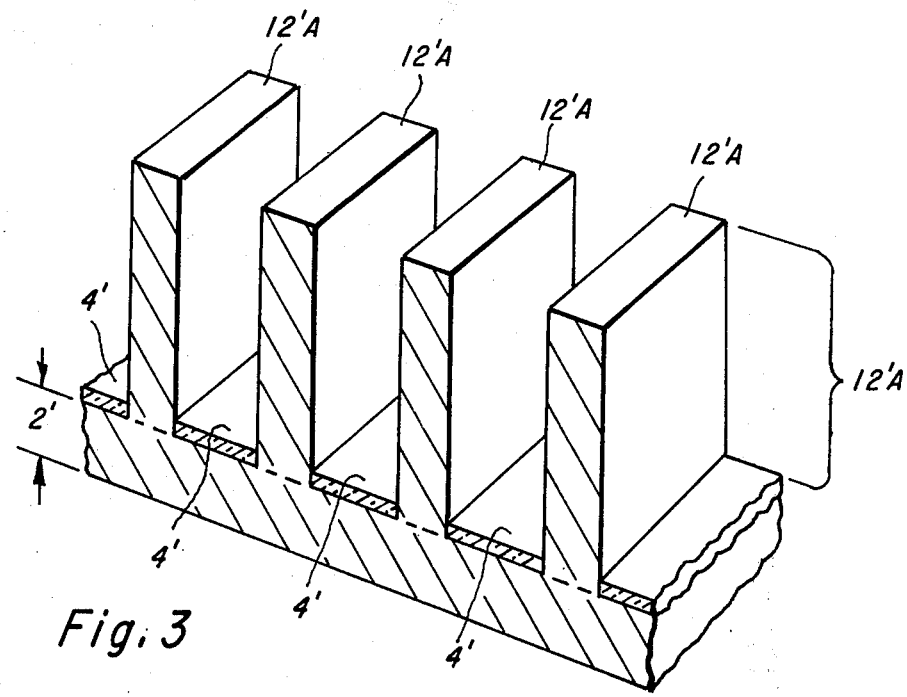
FIG. 3 depicts an alternative method of providing the structure of FIG. 1B.
Figure 4:
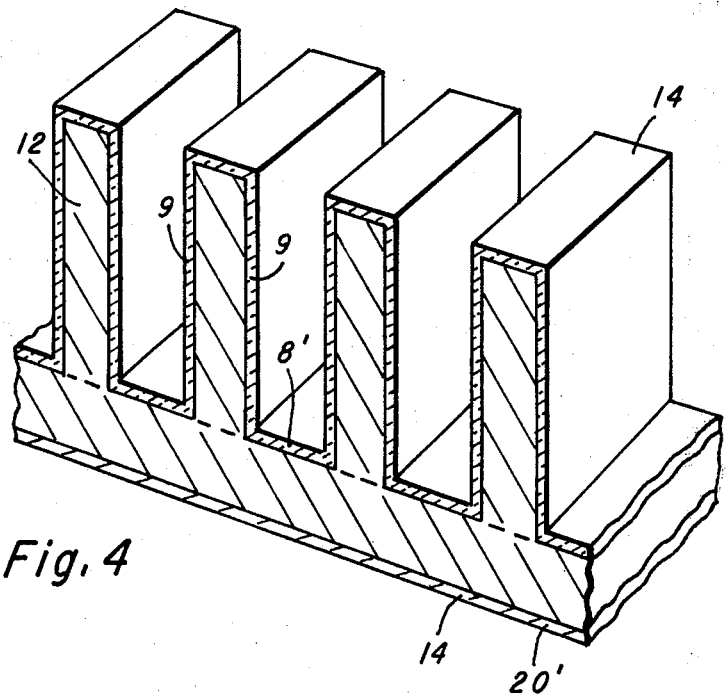
FIG. 4 depicts the substrate of FIG. 1B having an overlying layer of dielectric.

Although depicted in FIGS. 1B, 3 and 4 as flat, groove 8 is typically notched in a V-shape. Grooves having such V-shaped bottom portions 9' are equally suitable within the scope of this invention.

Figure 2A:
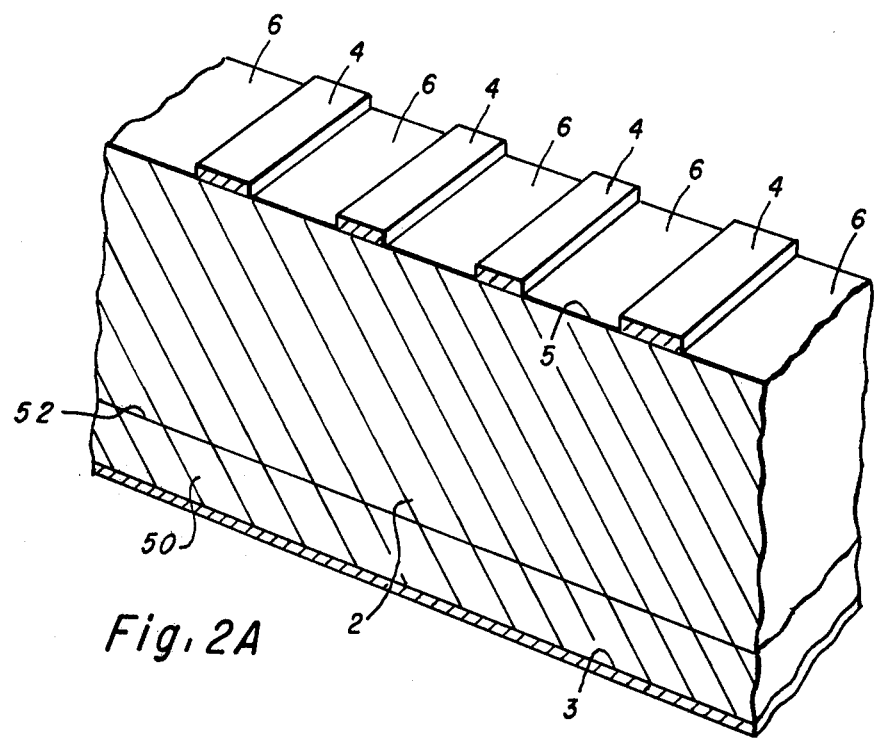
FIg. 2A depicts a portion of a P-type semiconductor substrate having thereon a masking layer with a desired mask pattern etched therein with a very low resistivity P-type layer 50 on the opposite side of the substrate.
Figure 2B:
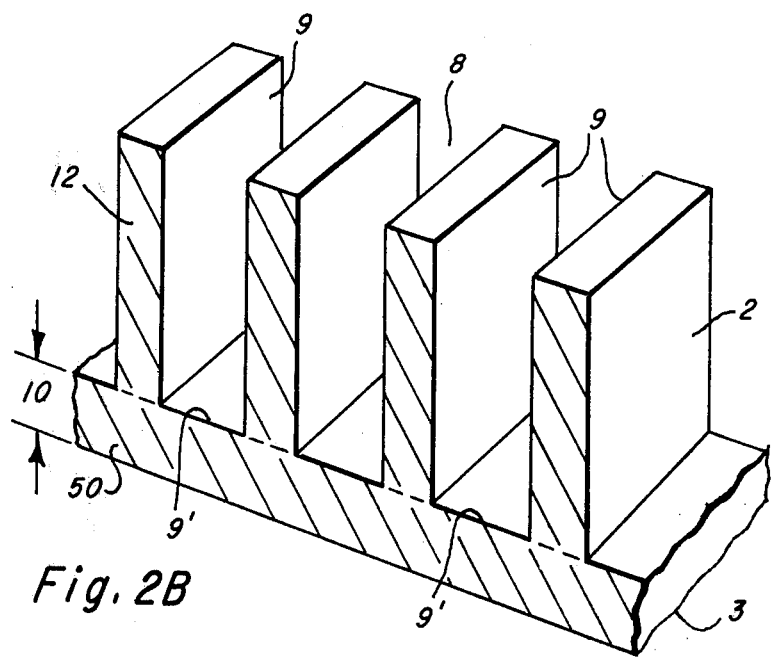
FIG. 2B depicts the semiconductor substrate of FIG. 2A having orientation dependent etched grooves therein down to the very low resistivity P-type layer.

Referring now to FIG. 2A, there is shown a structure identical to FIG. 1A with like character references denoting like parts with the exception that the substrate portion 2 is of P+ conductivity type with an acceptor concentration greater than $5 \times 10^{19}$ atoms/cm$^3$ but less than $7 \times 10^{19}$ atoms/cm$^3$ and the substrate portion 50 is of P++ conductivity type with an acceptor concentration of greater than $7 \times 10^{19}$ atoms/cm$^3$. When the structure of FIG. 2A is etched with an ODE such as 12 wt.% KOH, 66 wt.% H$_2$O, and 22 wt.% n-propanol, etching will take place down to the junction 52 and stop. Therefore, the depth of the etch can be accurately controlled. The width and length of the groove is determined by the dimensions of the apertures 6 in the mask. Therefor, the entire surface area of the etched device as shown in FIG. 2B can be accurately predetermined with reproducible results. The remainder of the processing will be the same as the embodiment of FIG. 1A. Note that various other etch stops could replace the P++ region, such as a noble metal, oxide, or nitride, to provide similar precise depth control.

Figure 2C:
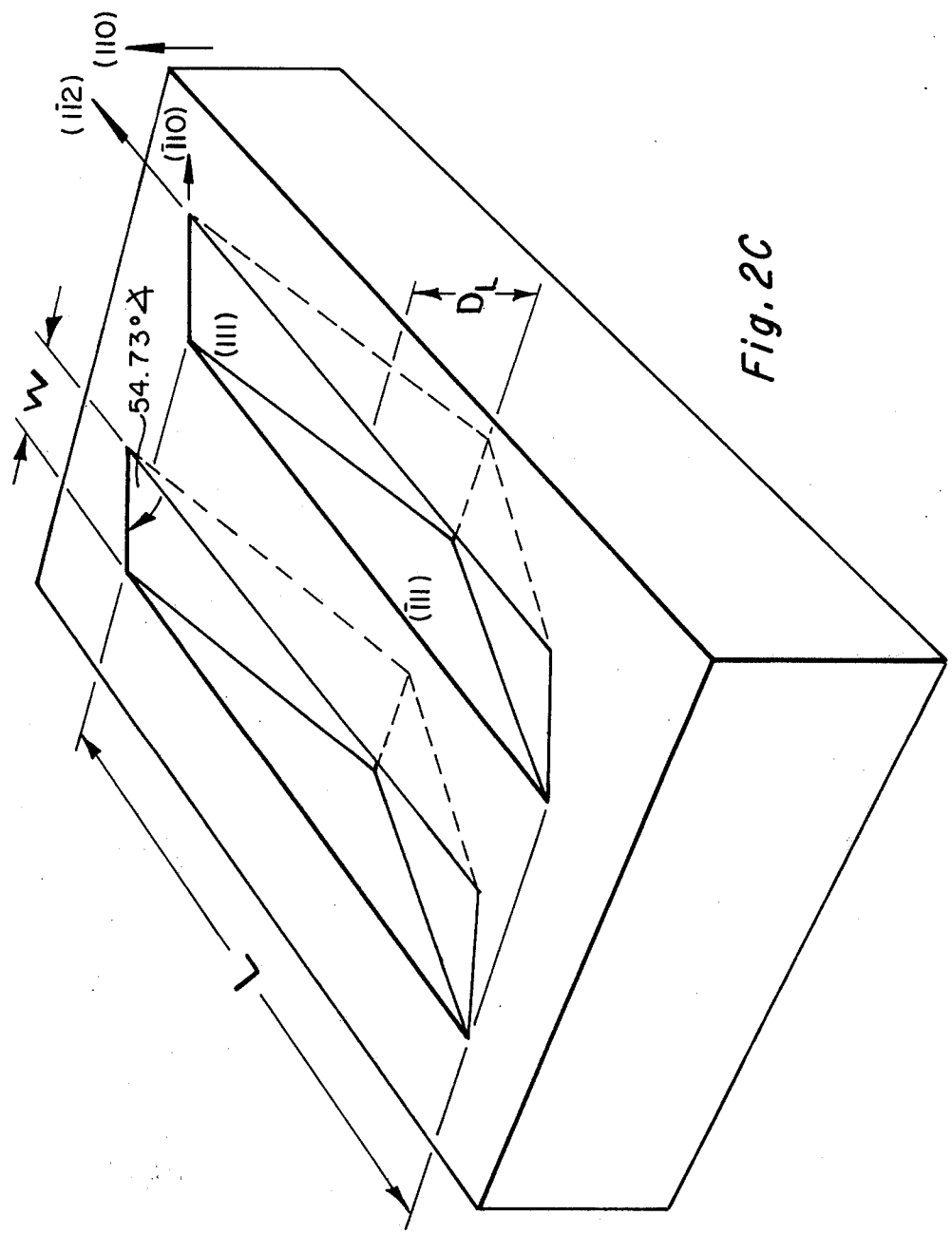
FIg. 2C depicts a semiconductor substrate having orientation dependent etched grooves therein of predetermined length.

Referring now to FIG. 2C, there is shown a structure similar to that of FIG. 1A, but one that has narrow grooves of width W having a predetermined length L. When using an orientation dependent etch which etches all crystal planes at a faster rate than the {111}, such as 50%/KOH/H$_2$O, for example, the grooves develop {111} facets at their ends that are not perpendicular to the {110} slice surface. Since these {111} facets are very slow etching, the groove will virtually stop etching when the groove reaches a depth $D_L = L/2 \sqrt{3}$. The resulting narrow groove is then bounded by four slow etching planes, two of which are the sidewall {111} planes, which subtend 90° to the top {110} surface, and two of which are another pair of {111} planes that subtend 35° to the top {110} surface. Etching grooves of this configuration to completion allows much greater control of the groove surface area than does the more common method of simultaneously controlling time, temperature and chemical composition of the etching solution.

It will be noted in FIG. 2C that the ends of the aperture subtend an angle of 54.73° to the long dimension of the aperture. This parallelogram shaped aperture allows the ultimate control of groove geometry and is important when the groove is not long compared to its width, that is, when L/W<20. However, for long narrow grooves with L/W>20, this particular aperture shape is not essential for good control of groove geometry; the end of the aperture can be square or even semi-circular and the end facets and ultimate groove depth will still be under adequate control for most purposes.

It is noted that other well-known techniques may be utilized to produce the basic structure of FIG. 1B. One such well-known method is that of orientation dependent epitaxial growth, as is explained in detail for a {110} crystallographic oriented silicon slice for growth in the {111} plane in copending patent application NEW DIELECTRIC ISOLATION PROCESS, Ser. No. 443,290 filed Feb. 19, 1974 and assigned to the assignee of this application. Further reference is directed to THE INFLUENCE OF CRYSTAL ORIENTATION ON SILICON SEMICONDUCTOR PROCESSING by K. E. Bean and P. S. Gleim, Proceedings of the IEEE, Vol. 57, p. 1469, 1969. Utilizing the method of crystal growth there described, a {110} monocrystalline silicon substrate 2', as illustrated in FIG. 3, has thereover grown an oxide masking layer 4', having the desired masking pattern etched therein. In this structure, the substrate 2' is approximately 5 mils in thickness and the oxide layer 4' is 10,000 angstroms in thickness. Following the techniques described in the referenced process, the monocrystalline growth studs 12'A are epitaxially grown perpendicular to the {110} substrate 2'. The process is discontinued when the growth studs 12'A reach the desired height of 20 mils, thereby providing the basic desired structure of FIG. 1B after removing mask 4.

A process which may be utilized to produce the basic structure of FIG. 1B without utilizing a {110} silicon substrate is to use the well-known technique of plasma or ion etching to form the grooves 8. Techniques are available in the ion or plasma etching art to form grooves 8 having substantially parallel sidewalls which are vertical to the surface. Also, such techniques are utilized to form grooves having other desired configurations.

After providing the structure of FIG. 1B, a layer of isolation oxide 14 is grown or deposited thereover as shown in FIG. 4. A sufficient thickness for this layer of oxide is approximately 2,000 angstroms. A SiO$_2$ capacitor with a 2,000 angstrom thick oxide produces a capacitance per unit area (C/A) of about 0.11 pf/mil$^2$. The breakdown voltage, $V_b$ is about 100 volts per 1,000 angstroms, and working voltages typically have amplitude $V_b/3$. Dielectric layer 14 may be any suitable dielectric besides silicon dioxide such as silicon nitride or tantalum oxide. However, to assure the largest capacitance per unit area, the dielectric layer 14 does not completely fill the grooves 8, but only coats the sidewalls 9 and the base 9' of the groove 8.

Figure 5A:
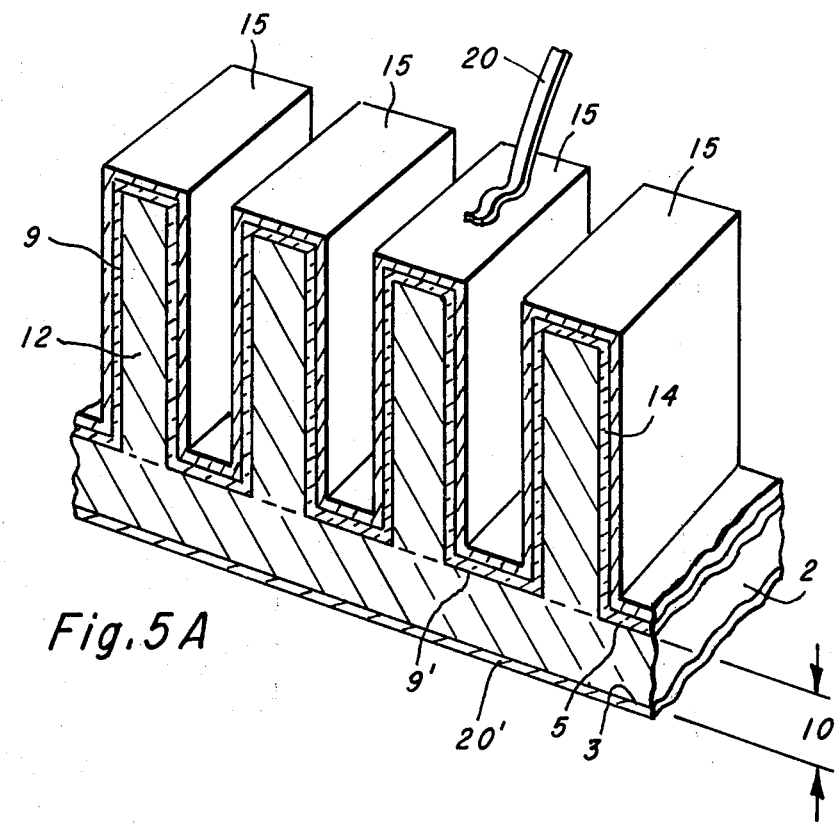
FIG. 5A depicts the structure of FIG. 1B having a metal layer overlying the dielectric layer.

As shown in FIG. 5A a layer 15 of a suitable metal such as aluminum, tantalum, or molybdenum is deposited over the dielectric layer 14. Although shown in FIG. 5A as a thin layer of metal coating the dielectric layer 14, it may be desirable to completely fill the grooves 8 with the metal 15 for ease of processing. Such a deposition is not detrimental to achieving maximum capacitance per unit area. After coating the dielectric layer 14 with the layer 15, electrical contacts 20 and 20' are applied to the metal layer 15 and to the surface 3. If desired, a highly doped semiconductor layer of the same conductivity type as that of the substrate may be formed on surface 3 prior to the deposition of the metal layer 20', as is well-known in the art for providing better electrical contact. As shown, the contact 20' to surface 3 covers substantially all of surface 3; however, partial coverage may suffice. Contact layer 20' to layer 3 may be applied concurrently with the formation of layer 15 if desired, for example, by vapor deposition of molybdenum.

Figure 5B:
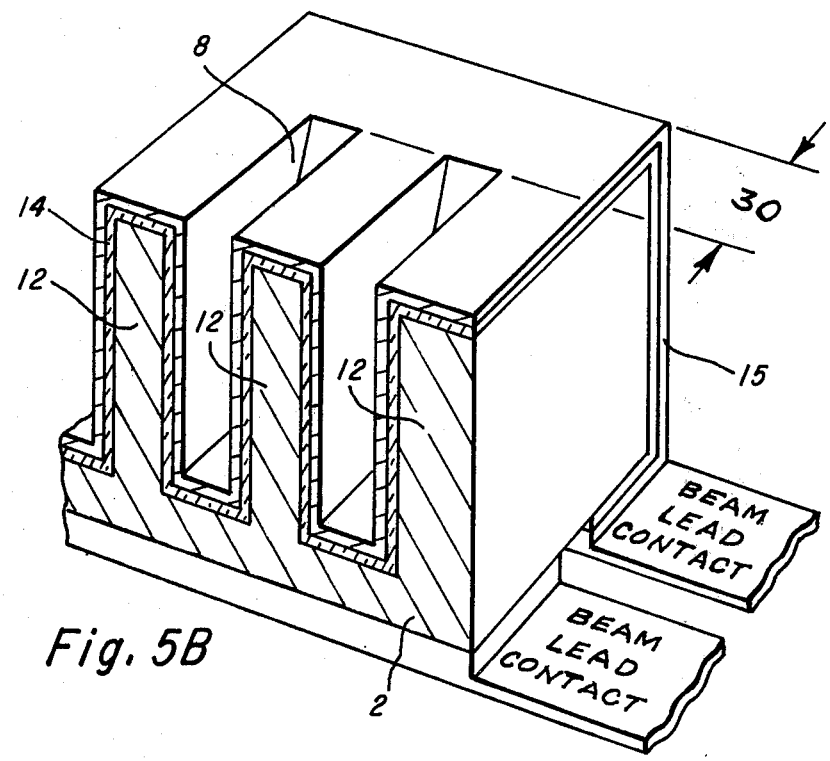
FIG. 5B depicts the structure of FIG. 5A wherein the ODE grooves do not extend completely across the surface of the substrate.

FIG. 5B depicts the basic structure of FIG. 5A wherein the orientation dependent etched grooves 8 do not extend completely across the substrate 2. Accordingly, a region 30 of substrate 2 remains unetched to provide support as illustrated in FIG. 5B. Such a configuration lends itself readily to the formation of electrical contacts utilizing beam leads. Beam lead technology is well-known in the art and easily applied to make electrical connection to metal layers 15 and 20'.

It is noted that a dielectric capacitor embodiment has been shown, but also such a basic structure is suitably provided in a P-N junction embodiment as hereafter discussed.

Although the silicon studs 12 are comprised of highly doped semiconductor material, the studs 12 still may exhibit significant electrical resistance at high frequencies. Accordingly, a highly doped layer of semiconductor material, such as phosphorus, to provide an N-type or boron to provide a P-type, may be diffused into the studs 12 to further decrease the inherent resistance. Such a diffusion may be desirable in all of the embodiments herein disclosed in this application.

Figure 6:
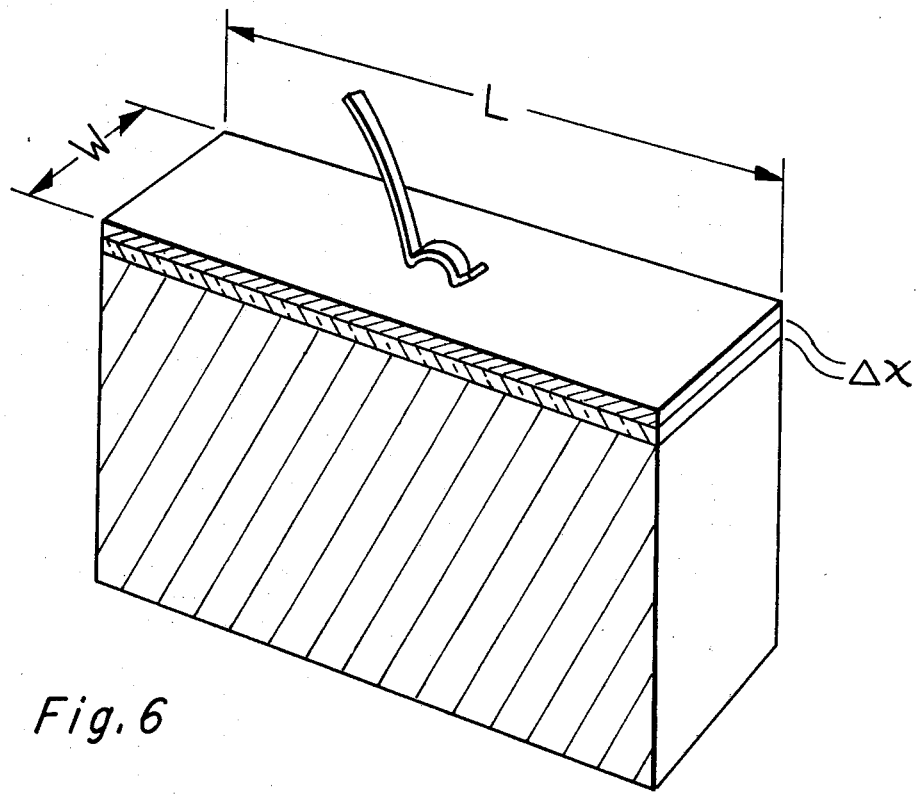
FIG. 6 depicts a conventional dielectric capacitor as constructed from a semiconductor substrate without the orientation dependent etch grooves.

Shown in FIG. 6 is a conventional semiconductor dielectric capacitor having dimensions W by L and having a dielectric layer thickness of $\Delta x$. The capacitance produced by the device of FIG. 6 is characterized by the equation:

$$C = \epsilon \epsilon_0 A / \Delta x \qquad 1$$

wherein $\epsilon$ is the relative dielectric constant,
$\epsilon_0$ is the permittivity of free space,
$\Delta x$ is the dielectric thickness, and
$A$ is the top surface area, which equals $L \times W$ Substituting $\Delta x = 2,000$ angstroms, $\epsilon = 3.8$, as typical for silicon dioxide, then the C/A for the conventional capacitor of FIG. 6 equals 0.11 pf/mil$^2$. However the C/A of the device of FIG. 5A is several times that of the device of FIG. 6, even 100 times as much due to the increased surface area provided by sidewalls 9. Devices produced according to the method of this invention have at least a 50% increase in surface area over conventional thin film capacitors. The device of FIG. 5A may render a hundredfold improvement in C/A over the conventional plane-surface capacitor depicted in FIG. 6 having a surface area of merely length times width. For example, for 20 mil deep grooves of 0.2 mils width separated by distances of 0.4 mils, the surface area of the etched-groove structure is 101 times greater than that of the plane-surfaced structure.

In order to obtain such deep narrow grooves, the alignment of the long dimension of the etch mask aperture will have to be parallel to within 0.1° of the intersection line between the {110} and the perpendicular {111} plane. This follows from our observation that the amount of etching (undercutting) $u$ on the {111} sidewalls is linearly dependent on the angle of misalignment $\theta$ from the above intersection line, the approximate expression being $D/u = 35/\theta°$, where $\theta$ is given in degrees. The above estimate of required precision for $\theta$ assumes an original aperture width of 0.08 mils, which is possible with some difficulty with optical photomasking, but which is easily obtainable using electron beam lithography. The precise alignment to within 0.1° is most readily accomplished by aligning the long parallel lines of the photomask to a precisely aligned {111} flat surface that is often ground on one edge of each slice.

If we adopt a goal of 20fold improvement in capacitance per unit area (C/A) with respect to the prior art, then the precision of alignment of the long dimension of the etch mask aperture to the {110} : {111} intersection must be within 0.875°. For example, for 10 mil deep grooves of 0.6 mil width separated by distances of 1.0 mil, the surface area of the etched-groove structure is 21 times greater than that of a plane-surfaced structure. This assumes an initial groove width of 0.1 mil.

Figure 5C:
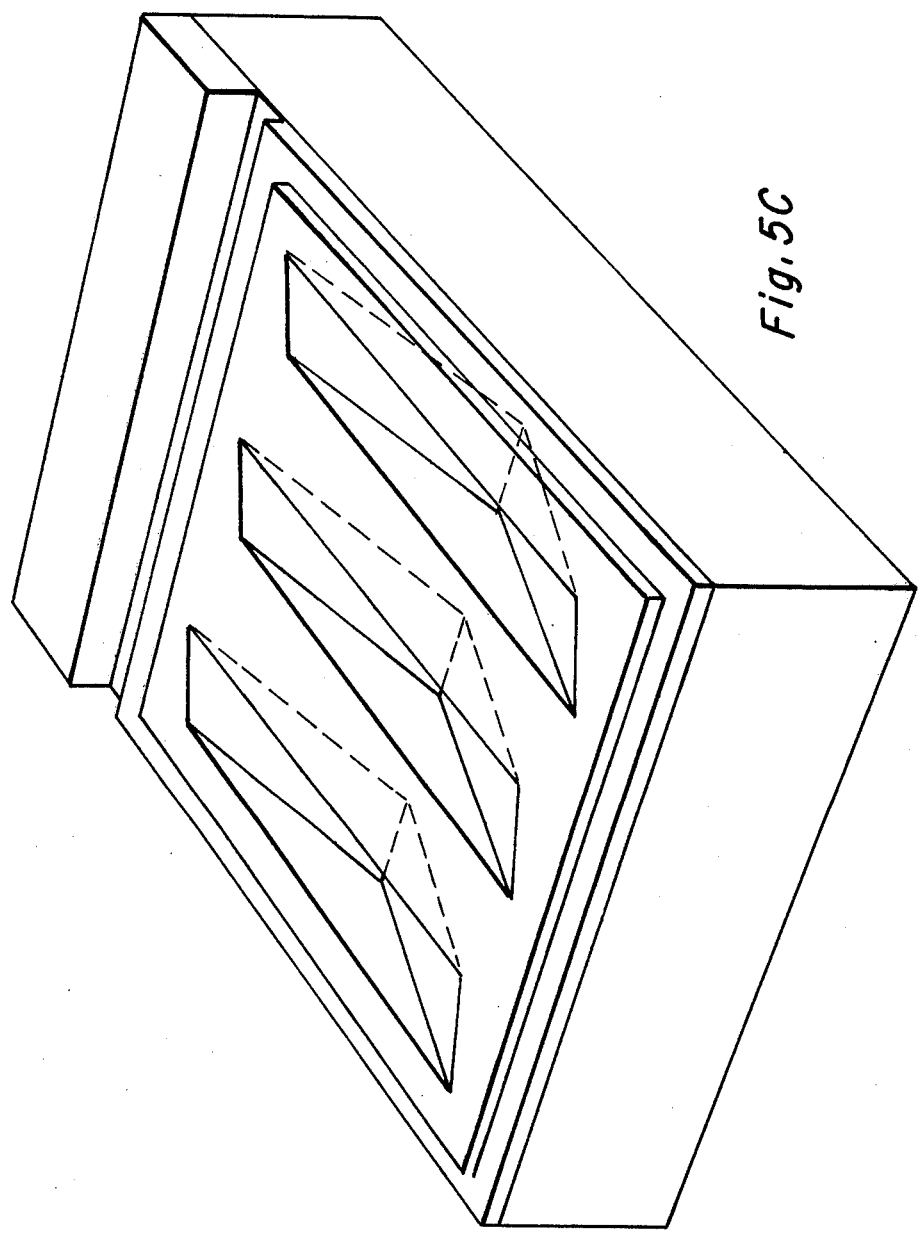
FIG. 5C depicts a structure similar to FIG. 5B wherein the grooves do not extend to any perimeter of the substrate, and the bead lead contact is on the upper surface.

It will be noted that both of the above examples require the grooves be open ended as shown in FIG. 1B. If the grooves are closed at each end as shown in FIG. 5C, then there are additional restrictions on the structure. For example, in order to achieve good control of the surface area of the grooved structure, the ratio of the groove depth to groove length, D/L, must be approximately $1/2 \sqrt{3}$, or 0.2887. This ratio is obtained when the groove reaches its maximum "normal" depth, that is, when the limiting sidewalls and groove bottom are all slow etching {111} planes. To reach a higher ratio than 0.2887, up to 0.30, it is necessary to overetch considerably, thereby running the risk that the remaining Si studs will become too thin to be adequate conductors or be dissolved completely. A depth greater than 5% above normal should not be attempted. A ratio as low as 0.20 can be readily obtained by interrupting the etch at a depth 30% less than maximum. A depth 5% greater than normal corresponds to an area, A, 10% greater than normal, while a depth 30% less than normal corresponds to an area A 10% less than normal.

A second flat on the other perpendicular {111} at an angle of 70.53° to the first flat is also sometimes employed to aid in photomask alignment when the parallelogram shaped etch apertures are utilized. This second flat (or simple notch in some cases) insures that the parallelogram opening will be aligned with all of its sides on {111} intersections. However, as mentioned earilier with respect to FIG. 2C, this special parallelogram shape is not essential for long narrow grooves.

Choosing a dielectric material in the device of FIG. 5A, such as $Ta_2O_5$, having $\epsilon$ of 25, instead of $SiO_2$, having an $\gamma$ of 3.8, further provides an increase of approximately 7 times, bringing the total increase in C/A to some 700-fold. One method of obtaining such a layer is by chemical vapor deposition of tantalum and then anodizing it to the desired thickness.

In the device of FIG. 5A, the portion 10 of substrate 2 is highly doped to a resistivity of at most 0.01 ohm-centimeters, as specified in accordance with FIG. 1A, and the monocrystal material lying above the dotted line in FIG. 5A is moderately doped to, at most, $10^{18}$ atoms/cm$^2$ with P-type dopants to provide a resistivity of at least 0.06 ohm-centimeters. The portion 10 of substrate 2 typically extends to a depth of ½ the width of the stud 12 below the bottom 9' of grooves 8 so as not to limit the voltage breakdown. The oxide layer 14 ($\alpha x$ in Equation 1) is 1,000 angstroms, and an MOS capacitor embodiment is formed. By applying a positive voltage to the top contact 20, depletion regions are formed in the surface of the lightly doped studs 12 which decrease the total capacitance as calculated according to Equation 1. For example, the maximum capacitance per unit area according to Equation 1, wherein $\Delta x = 1,000$ angstroms is 0.22 pf/mil$^2$. By applying a positive bias to the top contact, this capacitance is decreased to a minimum value $C_{min}/A = 0.198$ pf/mil$^2$, as derived according to S. M. SZE *Physics of Semiconductor Devices*, J. Wiley & Sons, New York, 1969, page 442. Such a structure, as above described, having a highly doped substrate with lesser doped studs thereon, is provded utilizing techniques well-known in the art.

P-N JUNCTION CAPACITOR EMBODIMENT

Figure 7A:
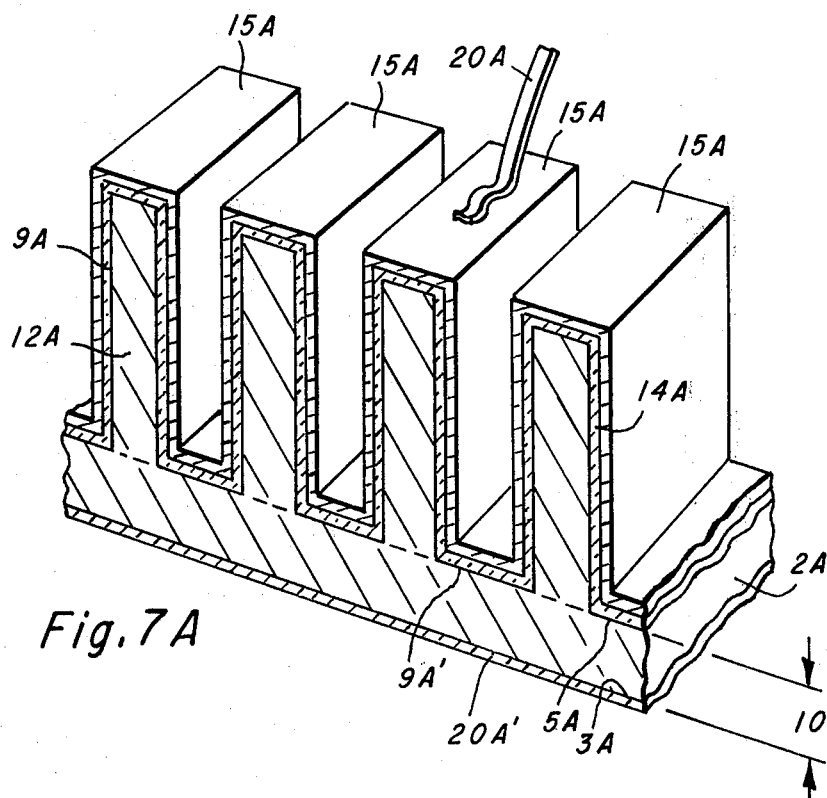
FIG. 7A depicts the P-N junction capacitor embodiment.

Another capacitor structure embodying the invention is illustrated in FIG. 7A. After providing the heavily doped P-type substrate 2 of FIG. 1B, having a resistivity of, at most, 0.01 ohm-centimeters utilizing techniques herein earlier described, a moderately doped layer of semiconductor material 14A of conductivity type opposite that of the substrate 2A is formed over the upper surface 5A, including the sidewalls 9A. Such a layer is formed by diffusion or expitaxial deposition techniques well-known in the art, utilizing phosphorous as an N-type dopant to provide an N layer and utilizing boron as a P-type dopant to provide a desired P-type layer. A typical doping level for layer 14A is $10^{16}$ atoms/cm$^3$. Each stud 12A is formed between adjacent grooves 8A of sufficient width to support the desired breakdown voltage characteristics. Reverse bias breakdown voltage/depletion layer width characteristics for silicon P-N junctions are readily available in the art. As in the capacitor of FIG. 5, the metal layer 15A is formed overlying the doped layer 14A. The grooves 8A are completely filled with metal 15A for ease of processing without degrading device performance, but they need not be completely filled.

Normal operation of the device of FIG. 7A is to reverse bias the P-N junction by applying the proper polarity voltages to the metal layer 15A (upper contact 20A) and to lower contacts 20A'. However, the device may also be forward biased up to approximately 0.5 volts to obtain a capacitance that increases with voltage.

As explained in conjunction with the dielectric capacitor embodiment, the increase in surface area A due to inclusion of the sidewalls 9A may be 100 times that of a singe P-N junction device formed on a planar surface, but is at least a 50% increase in area. Accordingly, the C/A is improved 100 times that of a conventional P-N junction capacitor. Of course, as the width of the stud decreases, the effective range of the applied voltage also decreases. Upon sufficient voltage application to the P-N junction, the depletion region extending into the stud from both sides 9A of the grooves eventually meet and cause pinch-off. Such a phenomena is a very useful design feature, since capacitance then decreases more rapidly in the pinch-off region with voltage than it does in the pre-pinch-off region.

Other substrates besides silicon are utilized in providing the large value capacitors described above. For example, gallium arsenide is one such suitable substrate. Gallium arsenide, however, when orientation dependent etching perpendicular to the {110} plane, provides a groove having only one sidewall perpendicular to the {110} plane. Such a device has decreased capacitance per area from that of similarly treated {110} silicon; however, a high value GaAs capacitor produced by the ODE method herein described still renders substantial improvement over existing planar dielectric devices.

Figure 7B:
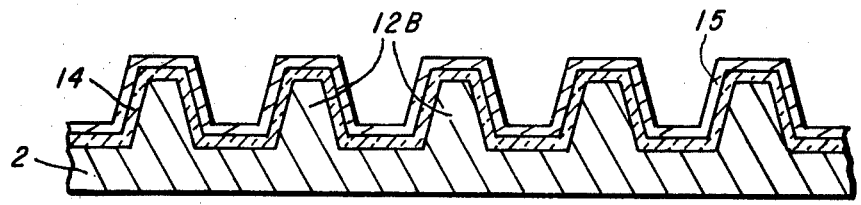
FIGS. 7B and 7C depict other embodiments of the invention wherein the sidewalls of the grooves are not parallel to each other and are not substantially perpendicular to the {110} plane.
Figure 7C:
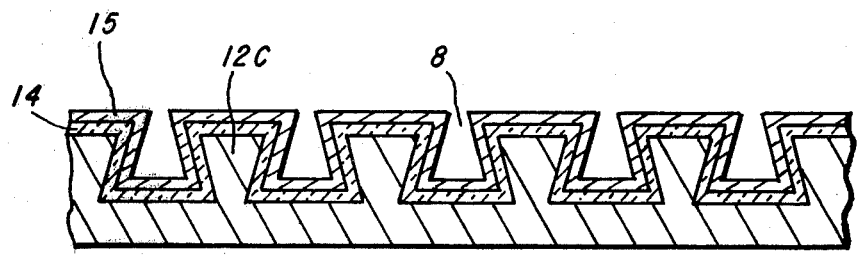

Although the previous capacitor embodiments have all had grooves having sidewalls parallel to one another and substantially perpendicular to the {110} plane, it often is desirable to provide studs 12A having sidewalls of different configurations, as illustrated in FIGS. 7B and 7C. That is, by utilizing {100} silicon material with a suitable ODE etch, trapezoidal-type or V-shaped studs 12B as in FIG. 7B result which have a base width greater than the apex width. Conversely, it often is desirable as shown in FIG. 7C to provide a trapezoidal type stud 12C having a base width less than the apex width. Such a structure results when a temperature gradient is utilized during the orientation dependent etch with the lower surface 3 maintains a higher temperature than the upper surface 5. Such a gradient etching technique allows faster etching near the lower surface 3, and accordingly the grooves 8 are wider at their bases than at their mouths. A gradient etching process also provides the trapezoidal-type studs of FIG. 7B if the upper slice surface is maintained at a higher temperature than the bottom surface.

Etching of the type shown in FIGS. 7B and 7C can be utilized in the embodiments of FIGS 1A, 1B, 2A and 2B. It should be noted that etching in accordance with FIG. 7B on a 100 provides an automatic built-in stop when the angled walls of the grooves finally meet at the apex of a triangle.

The structure of FIG. 3 is a useful basic structure for another P-N junction embodiment. That is, forming a capacitor in accordance with the process described in conjunction with FIG. 7A, having studs 12A moderately doped to provide a resistivity of at least 0.01 ohm-centimeters, but having that part of the substrate 2A lying below the studs 12A, region 10, highly doped to provide at most 0.01 ohm-centimeters. To provide the highly doped region 10, a doping level of at least $5 \times 10^{18}$ atoms/cm$^3$ is provided. When the studs 12A become fully depleted due to the applied voltage, then the highly doped substrate 2 below the dotted line, region 10, provides less resistance between the electrical contacts than if the substrate were less heavily doped.

Figure 7D:
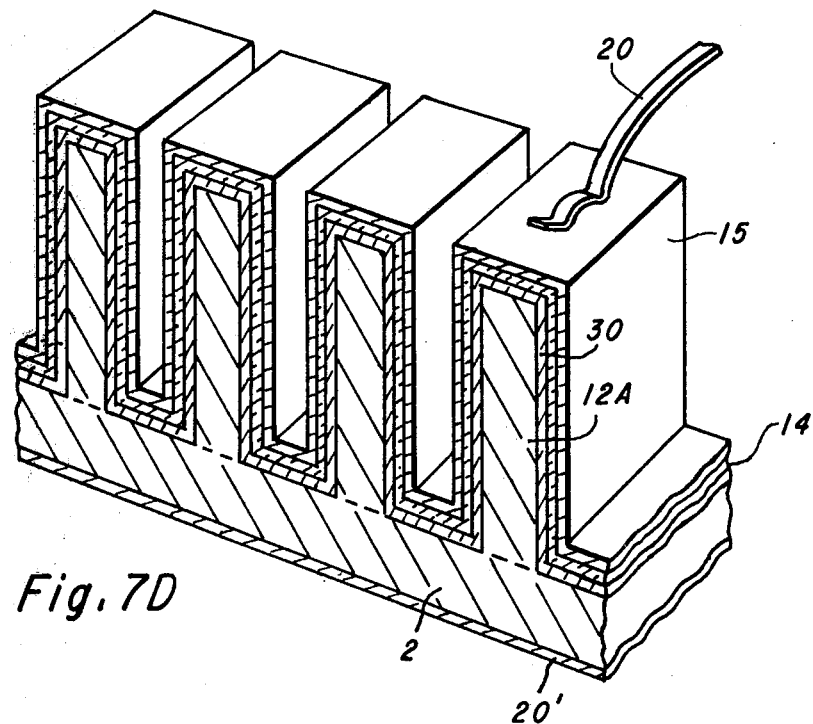
FIGS. 7D and 7E depict another P-N junction capacitor embodiment and Schottky diode embodiment respectively.

Another useful capacitor embodiment which provides for even less "saturated" resistance after the studs have pinched-off is provided by a structure as illustrated in FIG. 7D. If a structure is formed as in FIG. 1B, except that the starting substrate material 2 is highly doped to at least $5 \times 10^{18}$ atoms/cm$^3$, then a moderately doped layer 30 of less than $5 \times 10^{18}$ atoms/cm$^3$ of the same conductivity type subsequently formed thereover to at least a thickness of 250 A. A 250 A thickness for layer 30 provides working voltages of 2 volts maximum for the capacitor. Such a layer 30 may be epitaxially grown using the principles discussed in *J. Electrochemical Society*, Vol. 114, page 1154, 1967. Thereafter, following techniques earlier described in accordance with FIG. 7A to form a P-N junction capacitor, the capacitor of 7D is provided. As noted above, a minimum resistance results between the electrical contacts which, of course, allows a maximum Q, which is defined as the quality factor of the capacitor.

Figure 7E:
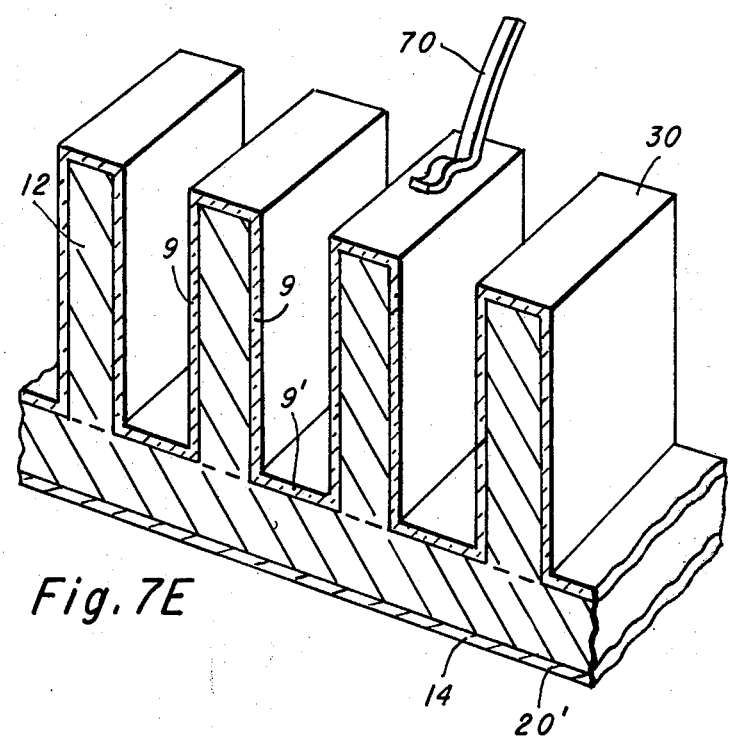

FIG. 7E depicts a substrate 2 as provided in accordance with FIG. 2 wherein substrate is moderately doped to a level less than $5 \times 10^{18}$ atoms/cm$^3$ and is, for example, N-type. Coating and overlying substrate 2 is metal layer 30 providing a Schottky barrier. Schottky barrier technology is well-known in the art, and a suitable metal for layer 30 is platinum silicide, PtSi, of any suitable thickness. Electrical contacts 20 and 20' provide contact thereto. Other suitable metals providing Schottky barriers are well-known, both for P-type and N-type silicon substrates.

Referring to FIGS. 5A and 7A, it is noted that the structures are similar in that a substrate 2 has an overlying layer 14 which is underlying a metal layer 15. The embodiment of FIG. 5A specifies a dielectric layer 14 and the embodiment of FIG. 7A specifies that the layer 14A be a semiconductor material of the opposite type of that of the substrate 2A. Another embodiment of this application combines the dielectric capacitor technique with the P-N junction capacitor technique. For example, a layer 14 is then provided which is partly dielectric and partly semiconductor of the opposite conductivity type of that of the substrate. Such a device then has a combination of a relatively voltage independent capacitance and a capacitance which is dependent upon voltage applied. For example, oxide is grown on the sidewalls of the studs 12 and on the bottoms 9' of the grooves 8 while the tops of the studs 12 have a diffused layer of opposite type and semiconductor.

INTEGRATED CIRCUIT EMBODIMENT

The previously described capacitor embodiments of the invention have been depicted as discrete electronic semiconductor devices. However, the method of the invention lends itself to application in integrated circuits; that is, the formation of high value capacitors in monolithic bodies. In dielectrically isolated integrated circuits, a {100} crystal-oriented silicon substrate has conventionally been utilized as the basic starting material. Although the spirit of applicants' invention includes orientation dependent etching {100} orientation material, optimum results are obtained when utilizing {110} oriented silicon starting material. The advantages realized from the utilization of {110} oriented material is that a higher packing density and a larger C/A gain on the capacitors is achieved due to the substantially vertical etch with respect to the {110} surface, which allows grooves to be formed in the surface to a considerable depth.

Utilization of the present invention need not be limited to dielectrically isolated integrated circuits, but are also suitably applied to P-N junction isolated circuits. For illustrational purposes only, a {110} crystal orientation semiconductor material is utilized as the starting material in a dielectrically isolated integrated circuit. Utilizing the scheme of dielectric IMPROVEMENT IN THE METHODS FOR FORMING CIRCUIT COMPONENTS WITHIN A SUBSTRATE AND SEMICONDUCTOR SUBSTRATE, Ser. No. 788,177, filed Dec. 31, 1968, now abandoned, and assigned to the assignee of this application, the embodiments earlier described are readily combined with conventional integrated circuit technology. For example, in FIG. 8 the high value capacitor I is shown integrated with a transistor II and an inductor III.

Figure 8:
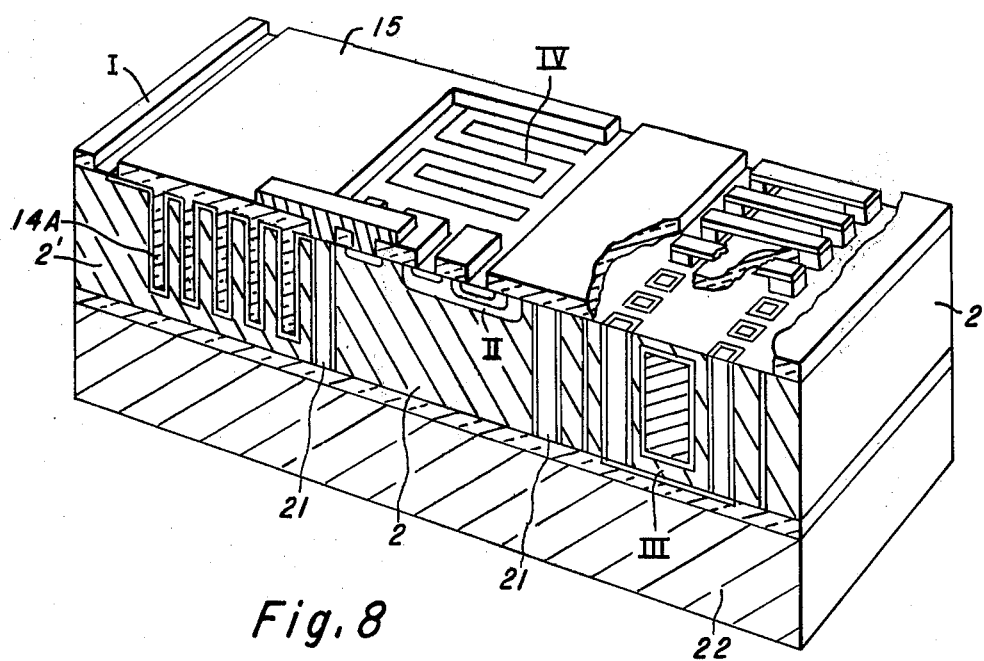
FIG. 8 depicts a dielectrically isolated integrated circuit having a high value capacitor therein.

A typical sequence of processes in constructing the device of FIG. 8 is:

1. Fabricating the conventional integrated circuit devices in a substrate 2.

2. Forming dielectric isolation regions 21 utilizing such methods as orientation dependent etching.

3. After properly masking against ODE, forming the orientation dependent etched grooves in the region 2' wherein the capacitor is desired.

4. Forming a thin coating of oxide 14A or other dielectric in the grooves and on the surface of the region 2', as earlier described with respect to the discrete dielectric embodiment.

5. Filling the grooves with metal and interconnecting them by forming metal layer 15 as earlier described in conjunction with discrete dielectric capacitor embodiment.

6. Attaching electrical interconnects to the region 2' and metal layer 15 which themselves are interconnected to other devices in the integrated circuit, such as the transistor II and resistor IV.

Referring again to FIG. 8, the P-N junction capacitor embodiment is depicted if the layer 14A is a semiconductor material of opposite conductivity type from that of semiconductor material 2'. It is emphasized that in the dielectric capacitor integrated circuit embodiment layer 14A is a dielectric layer and in the presently described P-N junction integrated circuit capacitor embodiment the layer 14A is the layer of opposite type semiconductor material. The high value capacitor I is then interconnected with other circuit elements such as the transistor II having its collector shown connected with the capacitor I.

SECOND INTEGRATED CIRCUIT EMBODIMENT

Figure 9:
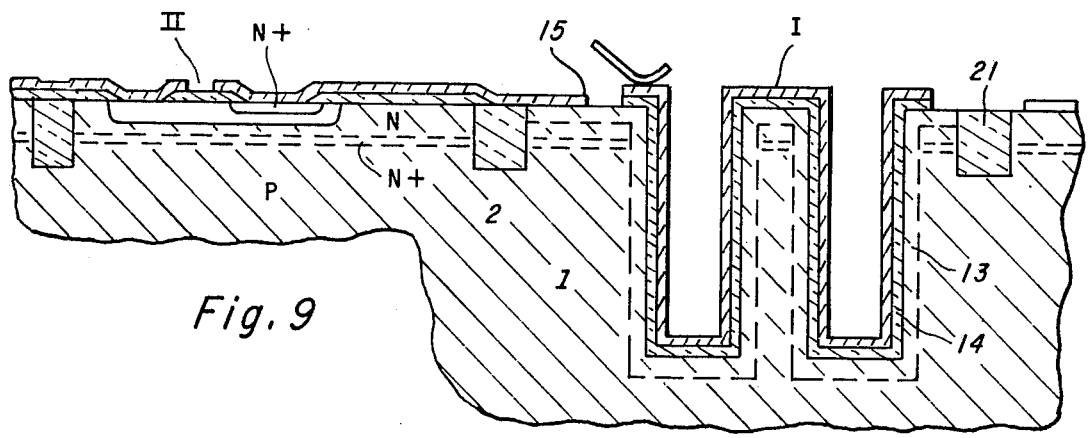
FIG. 9 depicts a second integrated circuit embodiment utilizing a diffused isolation process.

Shown in FIG. 9 is an integrated circuit embodying a high value capacitor in accordance with the method of the invention, wherein diffusion isolation is utilized. In forming such a circuit, techniques well-known in the integrated circuit art are utilized in combination with the methods herein earlier described. The essential difference between the circuit of FIG. 9 and the circuit of FIG. 8 is that prior to the formation of the layer 14 in FIG. 9 a layer 13 of semiconductor material of opposite conductivity type from that type of the substrate 2 is provided overlying the surface of the substrate within the isolated region wherein the capacitor is desired. Thus, the isolation 21 is a P-N junction type isolation instead of a dielectric isolation. Thereafter, the techniques earlier described for forming a dielectric capacitor or a P-N junction capacitor may be utilized. As shown in FIG. 9, if the layer 14 is a dielectric, then a dielectric capacitor is depicted and if the layer 14 is a semiconductor layer of opposite conductivity type from that of the adjacent semiconductor layer, then the depicted capacitor embodiment is a P-N junction capacitor within the integrated circuit. One terminal 15 of the capacitor is shown connected to the emitter of the NPN transistor II.

VARIABLE CAPACITOR EMBODIMENT

Figure 10:
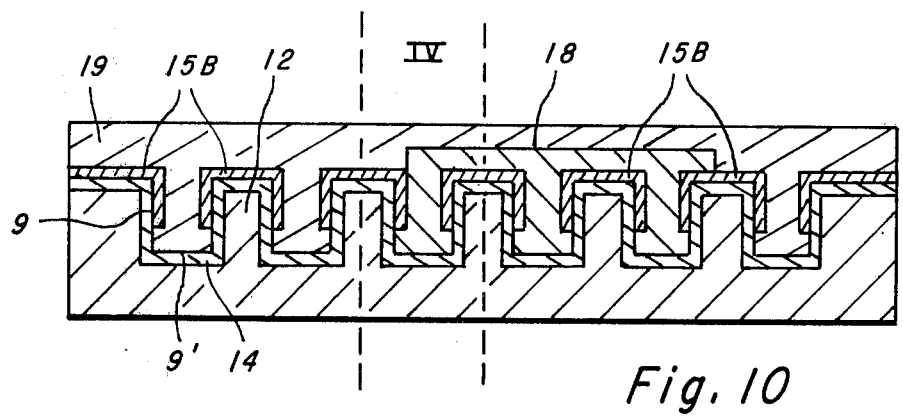
FIGS. 10 and 11 depict embodiments having a plurality of discrete capacitors according to the method of the invention wherein the total capacitance is controlled by selective interconnection.

Depicted in FIG. 10 is an embodiment of the present invention wherein the total capacitance provided by the device is controlled by interconnecting the desired number of individual capacitors. If, as shown in FIG. 10, in one of the previous embodiments the overlying metal layer 15B is not continuous, then a plurality of separate capacitors IV is formed. That is, instead of completely coating studs 12 and the base 9' of the grooves 8, as earlier described, coating only the sidewalls 9 of studs 12 while leaving the base 9' uncoated, provides separate capacitance. Then only by subsequent interconnection by additional contacts are the plurality of individual capacitors IV connected.

Providing such intermittent metal layer as shown in FIG. 10 is achieved utilizing metal deposition techniques known in the art. For example, by filament or electron-beam evaporation from a localized source, one can position the slice so that only one sidewall and the top of the studs 9 are coated. Subsequently, the opposite sidewall is coated by re-orienting the slice.

Figure 11:
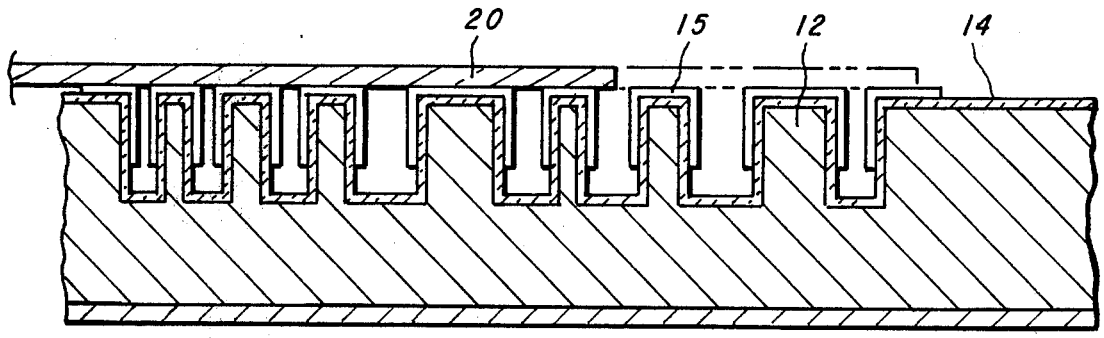

Thereafter, a layer of oxide 18 is selectively formed overlying the intermittent metal so that a subsequent metal deposition 19 selectively interconnects the desired number of individual capacitors. Such an interconnect configuration is exemplary only and other electrically insulated interconnect systems may be utilized. For example, if electrically isolated leads are connected individually to the capacitor studs, they may be selectively interconnected after processing via well-known electronic switch circuits to provide capacitance tuning. If the device of FIG. 10 were a discrete capacitor, as earlier described, and not an integrated circuit, then a conventional slide contact is utilized as shown in FIG. 11. Such a sliding contact method is generally unsuited for integrated circuits due to the small size of integrated circuits.

Although specific embodiments of this invention have been described herein in conjunction with one semiconductor material, other semiconductor materials, such as gallium arsenide or other III–V compounds, and other various modifications to the structural details will be apparent to those skilled in the art without departing from the scope of the invention.

What is claimed is:
1. A semiconductor integrated circuit comprising a monocrystalline silicon body having a major surface oriented in a 110 crystallographic plane, and having therein:
   a. an active semiconductor electronic device;
   b. a capacitor comprising:
      1. an electrically isolated portion of said semiconductor body having a plurality of spaced, parallel grooves therein the sidewalls of which lie substantially in 111 crystallographic planes, each groove having a length/width ratio less than 20, two of said 111 sidewalls being perpendicular to said 110 surface, and the other two 111 sidewalls sloping from the groove ends to a central v-shaped bottom;
      2. a layer of dielectric material coating said portion having said grooves therein;
      3. a layer of conductive material overlying and coating said dielectric layer; and
   c. electrical contacts interconnecting said electronic device to said conductive material and to said isolated portion, said capacitor having a per unit area capacitance of at least 2.0 pf/mil$^2$.

2. A semiconductor integrated circuit comprising a monocrystalline silicon body of one conductivity type having a major surface lying parallel to a 110 crystallographic plane, and having therein:
   a. active semiconductor devices;
   b. a capacitor comprising:
      1. an electrically isolated portion of said semiconductor body having a plurality of selectively spaced parallel grooves lying therein, the sidewalls of which are crystallographically oriented parallel to 111 planes, two of said 111 sidewalls being perpendicular to said 110 surface and the other two 111 sidewalls sloping from the groove ends to a central V-shaped groove bottom;
      2. a layer of silicon of opposite conductivity type coating said electrically isolated portions, and
      3. a layer of conductive material overlying and coating said layer of opposite conductivity type; and
   c. electrical contacts interconnecting said electronic devices and said portion and said conductive layer.

3. The circuit of claim 2 wherein said layer of conductive material is discontinuous, having selectively positioned voids therein to electricaly isolate selected portions of said layer of conductor overlying selected grooves.

4. The circuit of claim 3 further including a second conductive layer selectively interconnecting said discontinuous layer of conductive material to provide a programmable high value capacitor.

5. A semiconductor high value capacitor comprising:
   a. a semiconductor substrate having a major surface oriented in a 110 plane;
   b. selectively spaced, parallel grooves in said surface crystallographically oriented such that the groove sidewalls are aligned with 111 planes, two of said sidewalls being perpendicular to said 110 surface and the other two 111 sidewalls sloping from the groove ends to a central V-shaped bottom;
   c. a layer of dielectric material coating said surfce;
   d. a layer of conductor overlying and coating said dielectric layer and adapted to receive an electrical contact.

6. The capacitor of claim 5 wherein said layer of conductor is discontinuous, having selectively positioned voids therein to electrically isolate selective portions of said layer of conductor overlying said selected grooves.

7. The capacitor of claim 6 further including a second conductive layer selectively interconnecting said discontinuous layer of conductor and means for selectively interconnecting said selected portions to provide a programmable tunable high value capacitor.

* * * * *